(12) United States Patent
Garza et al.

(10) Patent No.: US 7,157,377 B2
(45) Date of Patent: Jan. 2, 2007

(54) METHOD OF MAKING A SEMICONDUCTOR DEVICE USING TREATED PHOTORESIST

(75) Inventors: Cesar M. Garza, Round Rock, TX (US); William D. Darlington, Austin, TX (US); Stanley M. Filipiak, Pflugerville, TX (US); James E. Vasek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 163 days.

(21) Appl. No.: 10/779,007

(22) Filed: Feb. 13, 2004

(65) Prior Publication Data

US 2005/0181630 A1  Aug. 18, 2005

(51) Int. Cl.
*H01L 21/311* (2006.01)
(52) U.S. Cl. ............... 438/694; 438/585; 438/705; 438/945; 438/947; 257/E21.026
(58) Field of Classification Search ............... 438/585, 438/694, 705, 945, 947
See application file for complete search history.

(56) References Cited

U.S. PATENT DOCUMENTS

| | | | |
|---|---|---|---|
| 6,245,489 B1 | 6/2001 | Baklanov | |
| 6,544,894 B1 | 4/2003 | Kobayashi | |
| 6,589,709 B1 * | 7/2003 | Okoroanyanwu et al. | ... 430/296 |
| 6,630,288 B1 * | 10/2003 | Shields et al. | ............... 430/313 |
| 6,716,571 B1 | 4/2004 | Gabriel et al. | |
| 6,790,782 B1 * | 9/2004 | Yang et al. | .................. 438/706 |
| 6,794,758 B1 * | 9/2004 | Ando | .......................... 257/773 |
| 6,815,359 B1 | 11/2004 | Gabriel et al. | |
| 6,849,515 B1 | 2/2005 | Taylor, Jr. et al. | |
| 2004/0244912 A1 * | 12/2004 | Tezuka et al. | ......... 156/345.24 |
| 2005/0026084 A1 | 2/2005 | Garza et al. | |

OTHER PUBLICATIONS

Martens et al., "Modification of 193nm(ArF) Photoresists by Electron Beam Stabilization," Proceedings of SPIE vol. 4345 (2001), pp. 138-148.
Ma, Plasma Resist Image Stabilization Technique (PRIST) Update, SPIE Vol. 333 Submicron Lithography (1982), pp. 19-23.

\* cited by examiner

*Primary Examiner*—Zandra V. Smith
*Assistant Examiner*—Christy Novacek
(74) *Attorney, Agent, or Firm*—James L. Clingan, Jr.; Michael Balconi-Lamic

(57) ABSTRACT

A semiconductor device is made by patterning a conductive layer for forming gates of transistors. The process for forming the gates has a step of patterning photoresist that overlies the conductive layer. The patterned photoresist is trimmed so that its width is reduced. Fluorine, preferably $F_2$, is applied to the trimmed photoresist to increase its hardness and its selectivity to the conductive layer. Using the trimmed and fluorinated photoresist as a mask, the conductive layer is etched to form conductive features useful as gates. Transistors are formed in which the conductive pillars are gates. Other halogens, especially chlorine, may be substituted for the fluorine.

19 Claims, 4 Drawing Sheets

METHOD OF MAKING A SEMICONDUCTOR DEVICE USING TREATED PHOTORESIST

FIELD OF THE INVENTION

1. Field of the Invention

The present invention relates to a method of making semiconductor devices and more particularly to the use of photoresist in such method.

2. Related Art

As manufacturing of semiconductors has involved smaller and smaller dimensions the photolithography has been moving to smaller and smaller wavelengths. The light provided at these reduced wavelengths has resulted in the need for different photoresists. This has been caused not just by the change in character of the light due to wavelength but also the reduced intensity of the light. With these required changes in the photoresist, the photoresists have also changed in their composition and thus in their response to etchants. One of the adverse effects has typically been that the photoresist etches more rapidly than previous photoresists. For example at 248 nanometers the ratio of etch rates for polysilicon to photoresist was about 3 to 1. For photoresists useful at 193 nanometers this ratio has been significantly reduced to about 1.5 to 1. Increasing the thickness of the photoresist is undesirable due to issues relating to depth of focus. Another adverse characteristic is that during the etch process the photoresist, for small dimensions, can even collapse during the thinning that inherently occurs during the etch. This collapsing issue is believed to be due to the reduced hardness of the photoresist used for lower wavelengths. For example, the Young's modulus, which is a typical measure of hardness, is about 40% less for a common 193 nanometer photoresist than for a common 248 nanometer photoresist.

Thus, there is a need for a semiconductor manufacturing process that alleviates or reduces one or more of these problems.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor device is made by patterning a conductive layer for forming gates of transistors. The process for forming the gates has a step of patterning photoresist that overlies the conductive layer. The patterned photoresist is trimmed so that its width is reduced. Fluorine, preferably $F_2$, is applied to the trimmed photoresist to increase its hardness and its selectivity to the conductive layer. Using the trimmed and fluorinated photoresist as a mask, the conductive layer is etched to form conductive features useful as gates. Transistors are formed in which the conductive pillars are gates. This is better understood with reference to the drawings and the following description.

Figure 1:
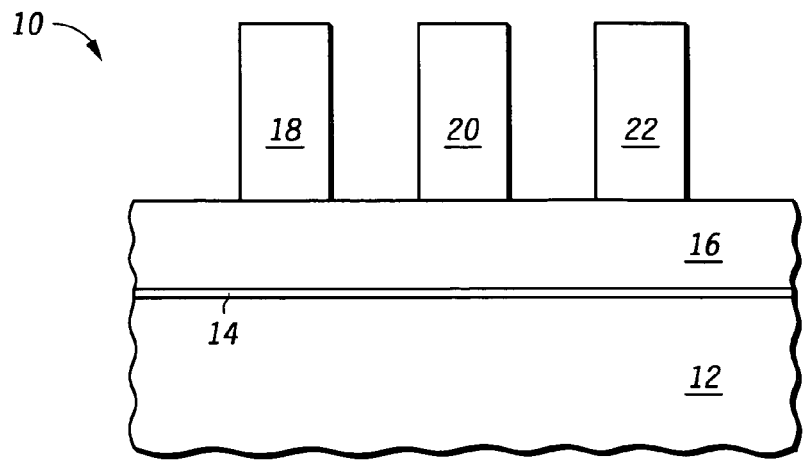
FIG. 1 is a cross section of a semiconductor device at a stage in processing according to the prior art.

Shown in FIG. 1 is a semiconductor device 10 comprising a substrate 12, a dielectric 14 over substrate 12, a layer 16, a photoresist feature 18, a photoresist feature 20, and a photoresist feature 22. Substrate 12 has a semiconductor layer below dielectric 14 that is useful for forming sources and drains. Substrate 12 may be a SOI substrate in which a dielectric layer is below the semiconductor layer. Layer 16 is polysilicon in this example, but could be another material, especially a conductive material such as a metal. Further, other layers that are not shown may also be included. For example an antireflective coating (ARC) may be on layer 16 and thus between layer 16 and photoresist features 18, 20, and 22. Photoresist features 18–22 are formed of a commercially available 193 nanometer photoresist material that contains hydrogen. Photoresist features 18–22 may have minimum dimensions such as 100 nanometers for a 193 nanometer technology.

Figure 2:
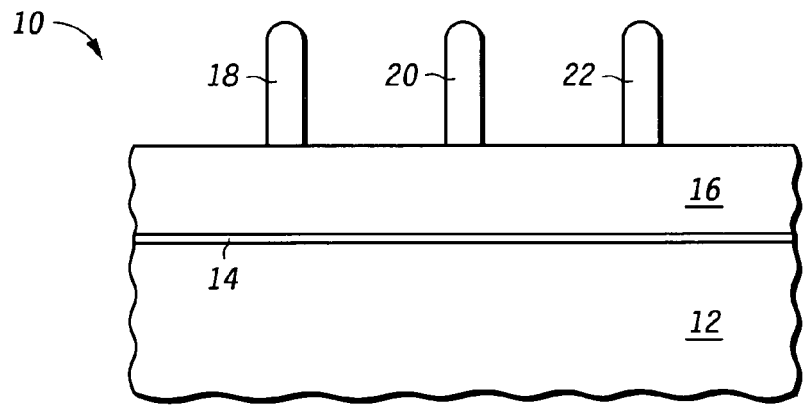
FIG. 2 is a cross section of the semiconductor device of FIG. 1 at a subsequent stage in processing useful according to the prior art.

Shown in FIG. 2 is device 10 after a trim step in which photoresist features 18–22 are reduced in width to about 40% of the original width so that the resulting width is about 40 nanometers for each one. This trimming is achieved with an isotropic etch process that is preferably a dry isotropic etch. It is desirable for the lateral etch rate to be relatively high but that is difficult compared to the etch rate that reduces the height of photoresist features 18–22. The height of photoresist features 18–22 may actually be reduced more than the width. These photoresist features 18–22 as trimmed in FIG. 2 are intended to be the masks for formation of gates of transistors.

Figure 3:
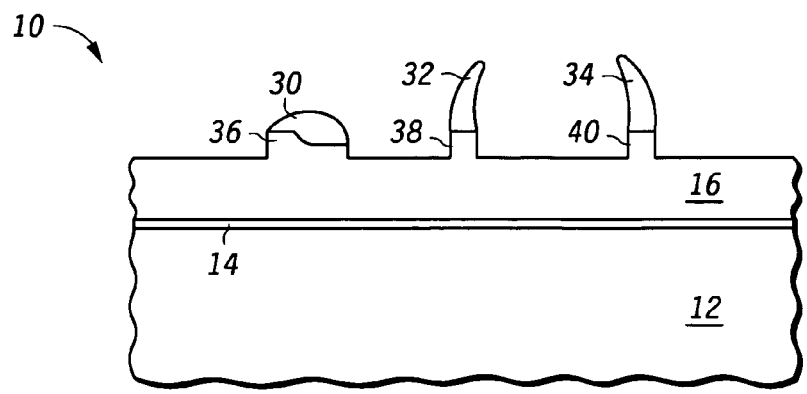
FIG. 3 is a cross section of the semiconductor device of FIG. 2 at a subsequent stage according to the prior art.

Shown in FIG. 3 is a partial etch of layer 16 using photoresist features 18–22 as a mask. The partial etch as shown is about one third of the way through layer 16 showing portions of intended gates 36, 38, and 40 formed in layer 16. A common result is that the photoresist features either fall over or are deformed. Photoresist piece 30 is a result of photoresist feature 18 falling over during etching. Deformed photoresist features 32 and 34 are formed from photoresist features 20 and 22, respectively, under etching conditions. Exemplary etch conditions for layer 16 being polysilicon are plasma containing chlorine, hydrogen bromine, oxygen, and argon with the pressure below one hundred millitorr, the temperature in the range of 30 to 100 degrees Celsius, flow rates for the various gases in the range of 10–200 SCCM, source power in the range of 200–2000 watts, and bias power in the range of 0–200 watts. The deformed photoresist features are likely also to fall over in continued processing and even if that does not happen they will shadow etching of layer 16. Collapsed photoresist feature 30 blocks etching in a much wider area than is desired but also is so thin that it will be completely etched through so that the polysilicon is etched where a gate is to be formed. This is a location of defect that cannot be repaired and would cause a failure that would prevent the device from operating properly.

Figure 4:
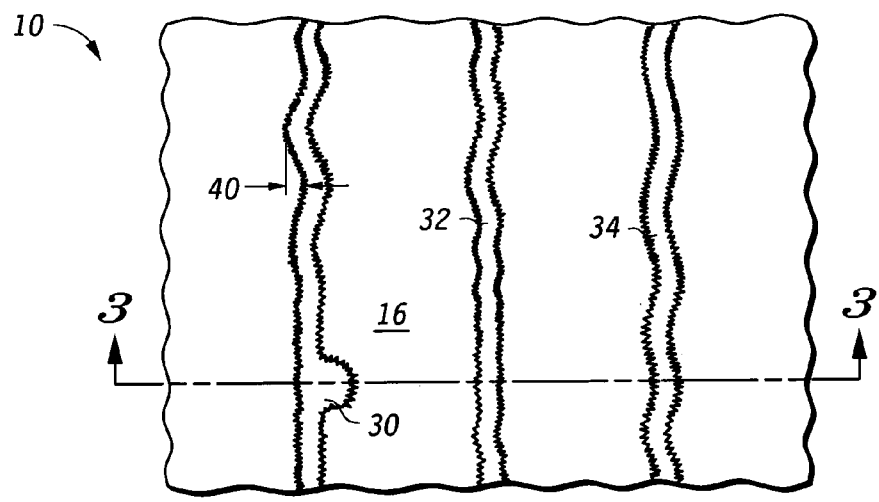
FIG. 4 is a top view of the semiconductor device of FIG. 3.

Shown in FIG. 4 is a top view of device 10 of FIG. 3. This shows that photoresist features 30, 32, and 34 have a low frequency and a high frequency variation that negatively impacts the utility of these features. A variation 40 in the edge of feature 30 in an area where it has not fallen over shows the magnitude of the effect of the low frequency variation. A magnitude of 20 nanometers for variation 40 is not unusual. The high frequency variation can often be 8 nanometers. These high frequency and low frequency variations are preferably as low as possible.

Figure 5:
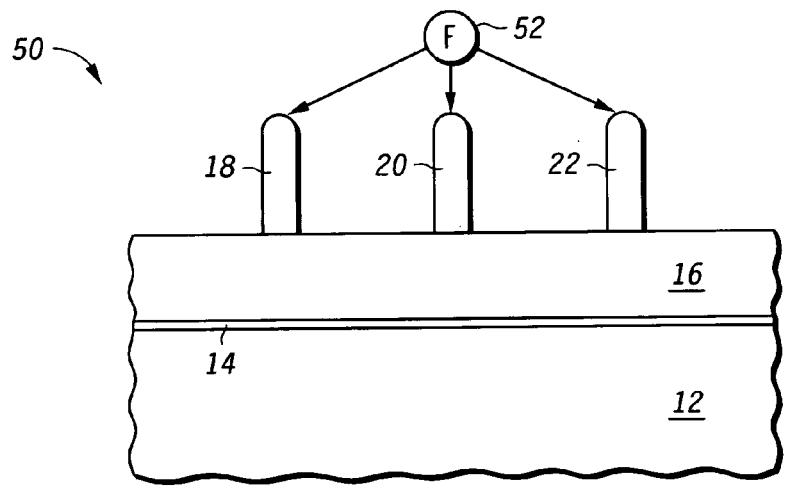
FIG. 5 is a cross section of the semiconductor device of FIG. 2 at a subsequent stage in processing according to an embodiment of the invention.
Figure 6:
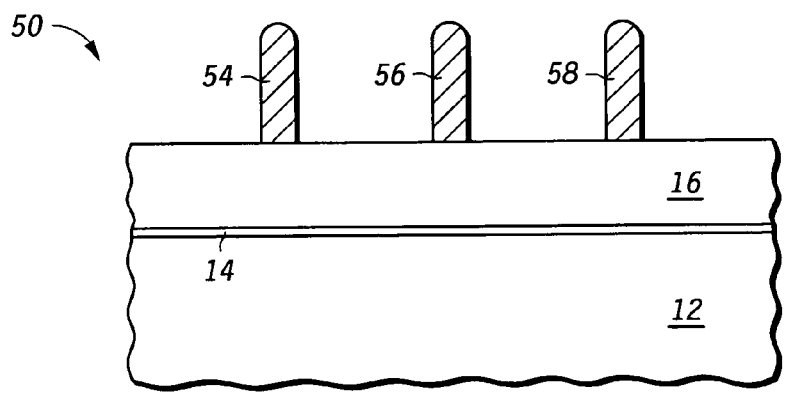
FIG. 6 is a cross section of the semiconductor device of FIG. 5 at a subsequent stage in processing according to the embodiment of the invention.

Shown in FIG. 5 is a preferred alternative of fluorinating photoresist features 18–22 prior to beginning the etch of layer 16 using a fluorine source 52. Preferably fluorine source 52 provides fluorine in the form $F_2$ (molecular fluorine). This transforms the character of photoresist features 18, 20, and 22 to be fluorinated photoresist features 54, 56, and 58, respectively, as shown in FIG. 6 in a semiconductor device 50. Molecular fluorine is preferred to atomic fluorine, F, because it will not just react at the surface of photoresist features 18–22 but also diffuse into the interior before reacting. With photoresist features 18–22 being so thin, the resulting fluorinated photoresist features 54–58 have fluorine throughout. The fluorine is applied preferably as molecular fluorine gas diluted in nitrogen. The temperature is preferably 30 degrees Celsius. Alternatively an effective temperature range is may be 10 to 40 degrees Celsius. Other temperatures may also be effective but deleterious effects have been found at higher temperatures such as 70 degrees Celsius. The fluorine concentration is about 1%. This concentration can be altered. Lower concentration will increase the time required. Ten minutes has been found to be effective for the 1% concentration. The pressure is preferably atmospheric but there may be advantages of reduced pressure such as being able to use the same chamber, or at least the same tool, in which the layer of polysilicon is etched. If the pressure is reduced, the initial fluorine concentration needs to increase proportionally to keep the processing time the same. Typically the whole tool is kept below atmospheric pressure. The fluorine is believed to have the effect of replacing hydrogen atoms so that fluorinated features 54–58 not only have more fluorine than photoresist features 18–22 but also less hydrogen. This has the effect of reducing the etch rate and increasing the stiffness of fluorinated photoresist features 54–58. After this fluorination step, the etching of layer 16 is performed.

Figure 7:
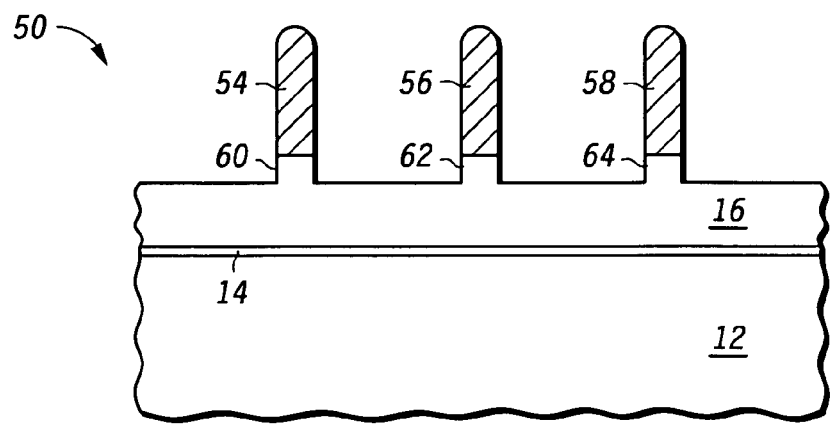
FIG. 7 is a cross section of the semiconductor device of FIG. 6 at a subsequent stage in processing according to the embodiment of the invention
Figure 8:
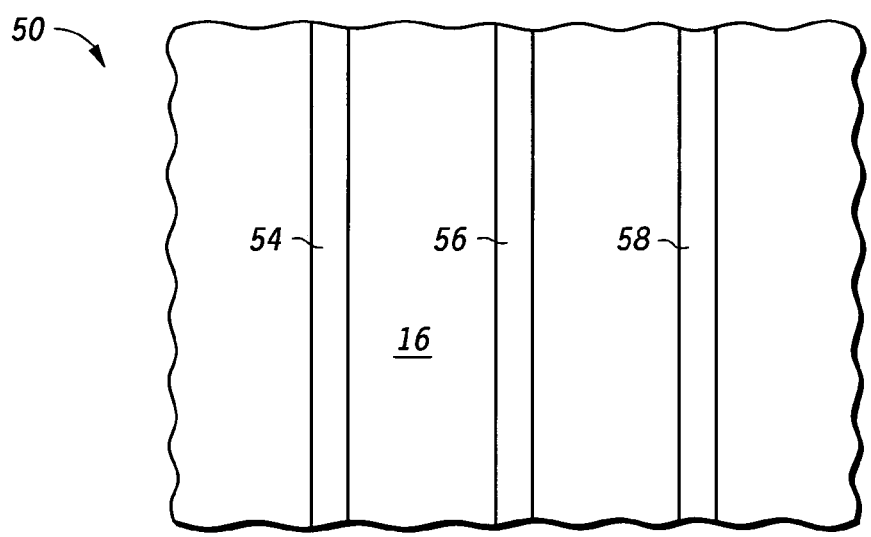
FIG. 8 is a top view of the semiconductor device of FIG. 7.

Shown in FIG. 7 is semiconductor device 50 after a partial etch of layer 16 under the same time and conditions as the etch of semiconductor device 10 shown in FIGS. 3 and 4. With the reduced etch rate and increased stiffness of fluorinated photoresist features 54–58, these features 54–58 do not collapse but retain their shape and form portions of intended gates 60, 62, and 64 in layer 16. The amount of size reduction is significantly less than that for photoresist features 32 and 34 as shown in FIGS. 3 and 4. Shown in FIG. 8 is a top view of semiconductor device 50 of FIG. 7. This shows that there is improvement in high frequency and low frequency variation. These variations are not likely to be completely eliminated but are significantly reduced. Even a reduction of ⅓ is a significant improvement.

Figure 9:
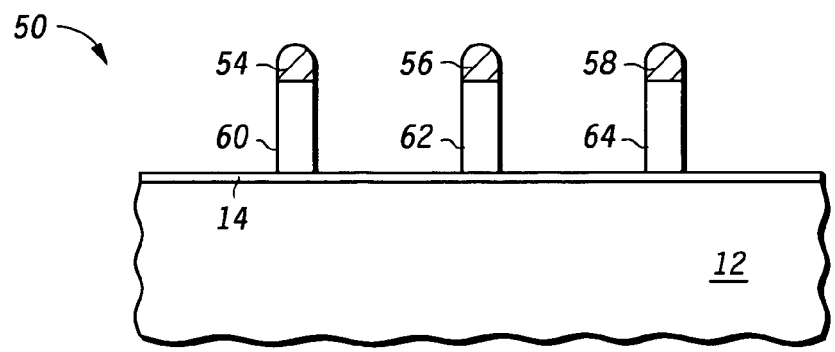
FIG. 9 is a cross section of the semiconductor device of FIGS. 7 and 8 at a subsequent stage in processing according to the embodiment of the invention.

Shown in FIG. 9 is semiconductor device 50 after completion of the etch of layer 16. This shows the completion of the formation of gates 60, 62, and 64 from layer 16. This is the desired result for gate formation. Fluorinated photoresist portions 54–58 have substantial height remaining even after completion of the patterning of layer 16. This provides for margin in the process and also may provide for the opportunity to reduce the photoresist thickness and thereby increasing the photoresist process focus budget.

Figure 10:
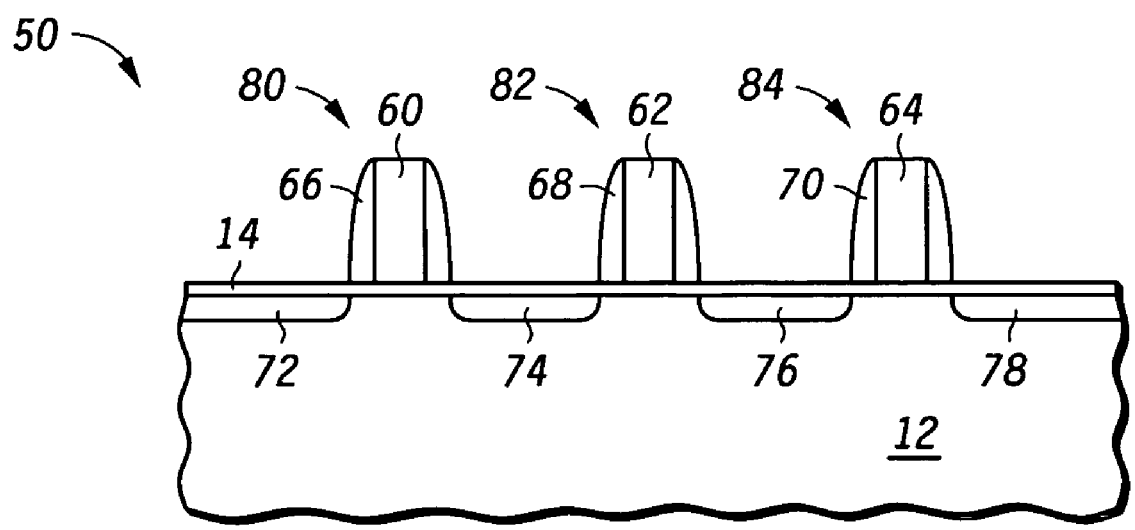
FIG. 10 is a cross section of the semiconductor device of FIG. 9 at a subsequent stage in processing according to the embodiment of the invention.

Shown in FIG. 10 is semiconductor device 50 after formation of transistors 80, 82, and 84 using gates 60, 62, and 64. Around gates 60, 62, and 64 are sidewall spacers 66, 68, and 70, respectively. Source/drain region 72 is adjacent to gate 60 on one side, source/drain region 74 is between gates 60 and 62, source/drain region 76 is between gates 62 and 64, and source/drain region 78 is on a side of gate 64 opposite from source/drain region 76. Source/drain region 74 is in common for transistors 80 and 82 but may preferably be separated into two regions by an isolation region. Similarly source/drain region is in common for transistors 82 and 84 but may be separated into two regions by an isolation region.

Thus, it is seen that a process for using 193 nanometer photoresist can be used to produce gates that have been trimmed to dimensions far below the resolution of the lithography itself and that this process can be performed in a single tool. After the photoresist has been applied, the semiconductor device can enter a single conventional tool and be processed therein until the gates are completed.

In addition to fluorinating photoresist features after trimming, fluorinating may also be applied prior to trimming, especially for measurement purposes. Typically even the process of measuring widths of 193 nanometer photoresist degrades the photoresist. Atomic fluorination may be applied prior to trim, followed by a measurement to ensure that the beginning width of the photoresist is as desired. If so, the trim process can begin even with the fluorinated photoresist. Because the use of atomic fluorination only results in an outer coating of fluorination, after the outer layer of fluorination is removed, the trim process can continue substantially as if there had not been a fluorination step. The fluorination can be at any stage for which a measurement is to be taken. The fluorination can be used as a protectant so that the wafer may be able to be removed from the tool for any variety of purposes and then be returned to the tool for continued processing.

Also another halogen, especially chlorine, may be substituted for fluorine to achieve a similar purpose. For example, wherever fluorine is used, chlorine may be substituted. Also, another halogen might also be effective and then simply a halogen can be substituted for fluorine. In such case the process of treating a photoresist feature with halogen to replace hydrogen atoms with halogen atoms can be considered to be halogenation of the photoresist feature.

In the foregoing specification, the invention has been described with reference to specific embodiments. However, one of ordinary skill in the art appreciates that various modifications and changes can be made without departing from the scope of the present invention as set forth in the claims below. For example, the gates have been described as polysilicon but they could also be another material such as a metal. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
   providing a substrate;
   providing a layer to be patterned overlying the substrate;
   providing a patterned photoresist layer overlying the layer to be patterned, the patterned photoresist layer having a minimum dimension;
   trimming the patterned photoresist layer;
   applying molecular fluorine gas to the patterned photoresist layer to change a property of the photoresist layer to be more resistant to a subsequent etch processing; and
   transferring the pattern of the trimmed patterned photoresist layer into the layer to be patterned.

2. The method of claim 1, wherein the layer to be patterned includes a stack of layers.

3. The method of claim 2, wherein the stack of layers including a sacrificial layer overlying an underlying layer to be patterned.

4. The method of claim 1, wherein trimming includes reducing the minimum dimension via at least one of mechanical and chemical processing.

5. The method of claim 4, wherein mechanical processing includes at least one of reactive ionic etching (RIE) and ionic bombardment etching.

6. The method of claim 4, wherein chemical processing includes reacting with at least oxygen.

7. The method of claim 4, wherein the minimum dimension is reduced by up to 80 percent of the minimum dimension.

8. The method of claim 4, wherein the minimum dimension is on the order of 100 nanometers and wherein by trimming, the minimum dimension is reduced to within a range of on the order of 20–80 nanometers.

9. The method of claim 1, wherein the property includes at least one of a chemical and a physical nature.

10. The method of claim 1, wherein the transferring the pattern includes at least a pattern transfer etch processing.

11. The method of claim 1, wherein the patterned photoresist layer is characterized by a first amount of high frequency line edge roughness, and wherein the applying molecular fluorine gas promotes at least one of i) a reduction in high frequency line edge roughness and ii) a resistance to additional high frequency line edge roughness.

12. The method of claim 1, wherein the trimming and the applying molecular fluorine gas are performed in a same tool.

13. The method of claim 1, wherein the layer to be patterned includes at least one of a conductive material, a semiconductive material, and an insulating material.

14. The method of claim 1, wherein the trimmed patterned photoresist layer includes a portion for forming a control electrode of a transistor.

15. A method for forming a semiconductor device, comprising:
    providing a semiconductor substrate;
    applying a photoresist layer over the substrate;
    patterning the photoresist layer to form a patterned photoresist layer;
    applying molecular fluorine to the patterned photoresist layer; and
    after applying the molecular fluorine, using the patterned photoresist to provide a pattern corresponding to the patterned photoresist under the patterned photoresist.

16. The method of claim 15, forming, prior to applying the photoresist, a layer over the semiconductor substrate, and wherein the pattern is formed in the layer.

17. The method of claim 16, wherein the applying the molecular fluorine alters a property of the patterned photoresist.

18. The method of claim 17, wherein the altered property is stiffness.

19. The method of claim 17, wherein the altered property is resistance to being etched.

* * * * *